United States Patent
Matsutani

(10) Patent No.: US 8,218,305 B2
(45) Date of Patent: Jul. 10, 2012

(54) FLAT PANEL DISPLAY DEVICE

(75) Inventor: Nobuhiro Matsutani, Osaka (JP)

(73) Assignee: Funai Electric Co., Ltd., Osaka (JP)

(*) Notice: Subject to any disclaimer, the term of this patent is extended or adjusted under 35 U.S.C. 154(b) by 299 days.

(21) Appl. No.: 12/762,448

(22) Filed: Apr. 19, 2010

(65) Prior Publication Data

US 2010/0265642 A1  Oct. 21, 2010

(30) Foreign Application Priority Data

Apr. 20, 2009 (JP) ................................. 2009-101923

(51) Int. Cl.
*H05K 5/00* (2006.01)
*H05K 7/00* (2006.01)

(52) U.S. Cl. ......... 361/679.21; 361/679.01; 361/679.22; 361/679.23; 361/679.26; 361/679.3

(58) Field of Classification Search ............. 361/679.01, 361/679.21, 679.22, 679.23, 679.26, 679.3
See application file for complete search history.

(56) References Cited

U.S. PATENT DOCUMENTS

| | | | |
|---|---|---|---|
| 6,807,051 B2 * | 10/2004 | Takahashi | 361/679.23 |
| 7,619,881 B1 * | 11/2009 | Granville et al. | 361/679.21 |
| 7,969,719 B2 * | 6/2011 | Chang et al. | 361/679.21 |
| 8,000,090 B2 * | 8/2011 | Moscovitch | 361/679.04 |
| 2005/0185365 A1 * | 8/2005 | Yamaguchi et al. | 361/679 |
| 2007/0097608 A1 * | 5/2007 | Matsutani et al. | 361/681 |

FOREIGN PATENT DOCUMENTS

JP  06-310878 A  11/1994

* cited by examiner

*Primary Examiner* — Anthony Haughton
(74) *Attorney, Agent, or Firm* — Global IP Counselors

(57) ABSTRACT

A flat panel display device includes a cabinet, a stand, a flat panel display component, and a universal cord holder. The flat panel display component is selectively connected to one of a non-detachable power supply cord and a detachable power supply cord. The universal cord holder includes a non-detachable power supply cord attachment structure and a detachable power supply cord attachment structure. The non-detachable power supply cord attachment structure of the universal cord holder engages with a first support member of the non-detachable power supply cord when the non-detachable power supply cord is connected to the flat panel display component. The detachable power supply cord attachment structure of the universal cord holder engages with a second support member of the detachable power supply cord when the detachable power supply cord is connected to the flat panel display component.

11 Claims, 10 Drawing Sheets

US 8,218,305 B2

FLAT PANEL DISPLAY DEVICE

CROSS-REFERENCE TO RELATED APPLICATIONS

This application claims priority to Japanese Patent Application No. 2009-101923 filed on Apr. 20, 2009. The entire disclosure of Japanese Patent Application No. 2009-101923 is hereby incorporated herein by reference.

BACKGROUND

1. Field of the Invention

The present invention generally relates to a flat panel display device. More specifically, the present invention relates to a flat panel display device to which one of a non-detachable power supply cord and a detachable power supply cord is selectively and electrically connected.

2. Background Information

FIGS. 9A and 9B are rear views of conventional flat panel display devices. In each case, the flat panel display device includes a liquid crystal television set. The flat panel display device has a stand 1', a linking bracket 2', and a liquid crystal module 3'. The liquid crystal module 3' is fixed on the stand 1' via the linking bracket 2'. The liquid crystal module 3' and the linking bracket 2' are covered with a cabinet 4'. An integrated power supply cord (e.g., non-detachable power supply cord) AC1' (see FIG. 9A, for example) or an inlet-type power supply cord (e.g., detachable power supply cord) AC2' (see FIG. 9B, for example) is connected to the control board of the liquid crystal module 3', and extends from the back of the cabinet 4'.

As shown in FIG. 9A, the integrated power supply cord AC1' has an engagement protrusion 5' integrally provided on the outer peripheral face of the cord, and the engagement protrusion 5' is removably latched to a holder 6' formed integrally with the cabinet 4'.

As shown in FIG. 9B, the inlet-type power supply cord AC2' has an inlet 7'. The inlet 7' has a female part 7a' and a male part 7b'. The female part 7a' and the male part 7b' can be removably fitted together, and are interposed at some point along the cord. The female part 7a' is latched to a holder 8' inside the cabinet 4'. Similar attachment structure for a power cable of a printer is also well known (see Japanese Laid-Open Patent Application Publication No. H06-310878).

With the conventional flat panel display device, the attachment structures for attaching the integrated power supply cord AC1' and the inlet-type power supply cord AC2' are different. Thus, two kinds of liquid crystal television sets have to be produced with these different attachment structures, which drives up the cost and also entails more assembly work.

SUMMARY

The present invention was conceived in light of the above-mentioned problems. One object of the present invention is to provide a flat panel display device to which one of an integrated power supply cord and a detachable power supply cord can be selectively attached with a simple attachment structure.

In accordance with one aspect of the present invention, a flat panel display device includes a cabinet, a stand, a flat panel display component, and a universal cord holder. The stand is fixedly coupled to the cabinet. The flat panel display component is disposed within the cabinet and fixedly coupled to the cabinet. The flat panel display component is selectively connected to one of a non-detachable power supply cord and a detachable power supply cord. The universal cord holder includes a non-detachable power supply cord attachment structure and a detachable power supply cord attachment structure. The universal cord holder is disposed within the cabinet. The non-detachable power supply cord attachment structure of the universal cord holder is configured to engage with a first support member of the non-detachable power supply cord when the non-detachable power supply cord is connected to the flat panel display component. The detachable power supply cord attachment structure of the universal cord holder is configured to engage with a second support member of the detachable power supply cord when the detachable power supply cord is connected to the flat panel display component.

With this flat panel display device, it is possible to provide a flat panel display device to which one of an integrated power supply cord and a detachable power supply cord can be selectively attached with a simple attachment structure.

BRIEF DESCRIPTION OF THE DRAWINGS

Referring now to the attached drawings which form a part of this original disclosure.

DETAILED DESCRIPTION OF EMBODIMENTS

A preferred embodiment will now be explained with reference to the drawings. It will be apparent to those skilled in the art from this disclosure that the following descriptions of the preferred embodiment are provided for illustration only and not for the purpose of limiting the invention as defined by the appended claims and their equivalents.

Figure 1A:
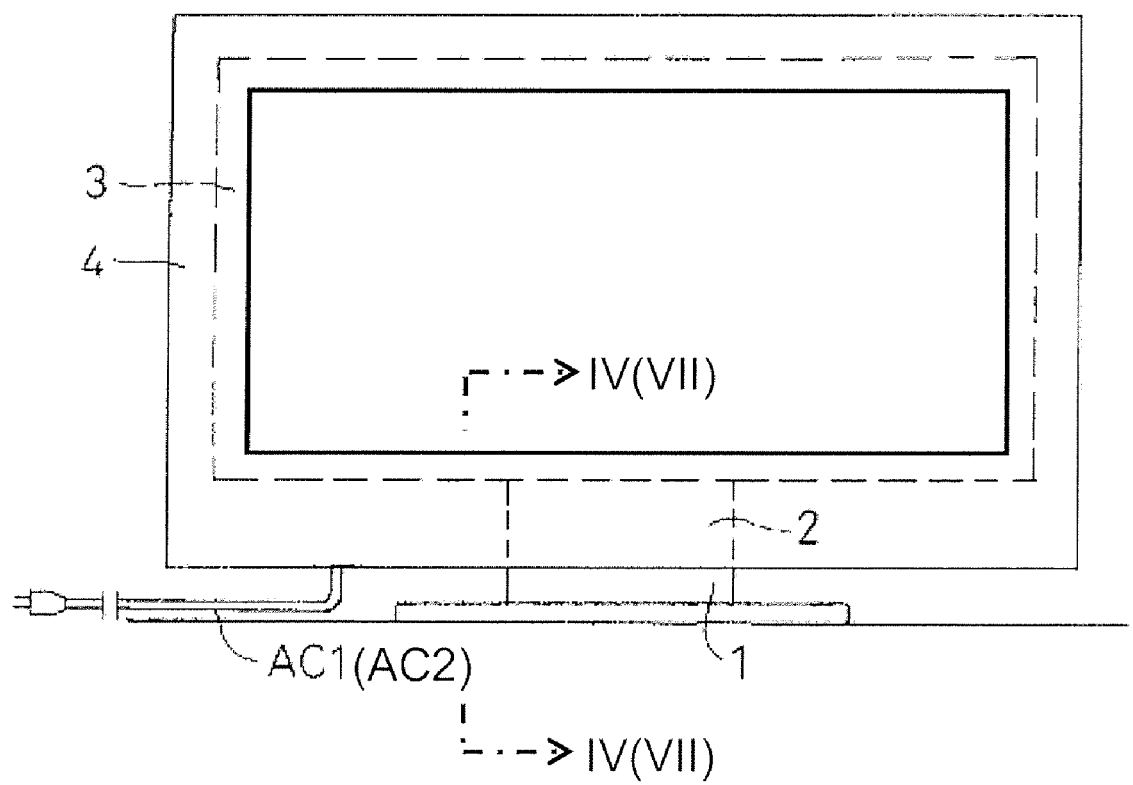
FIG. 1A is a front elevational view of a flat panel display device in accordance with one embodiment.
Figure 1B:
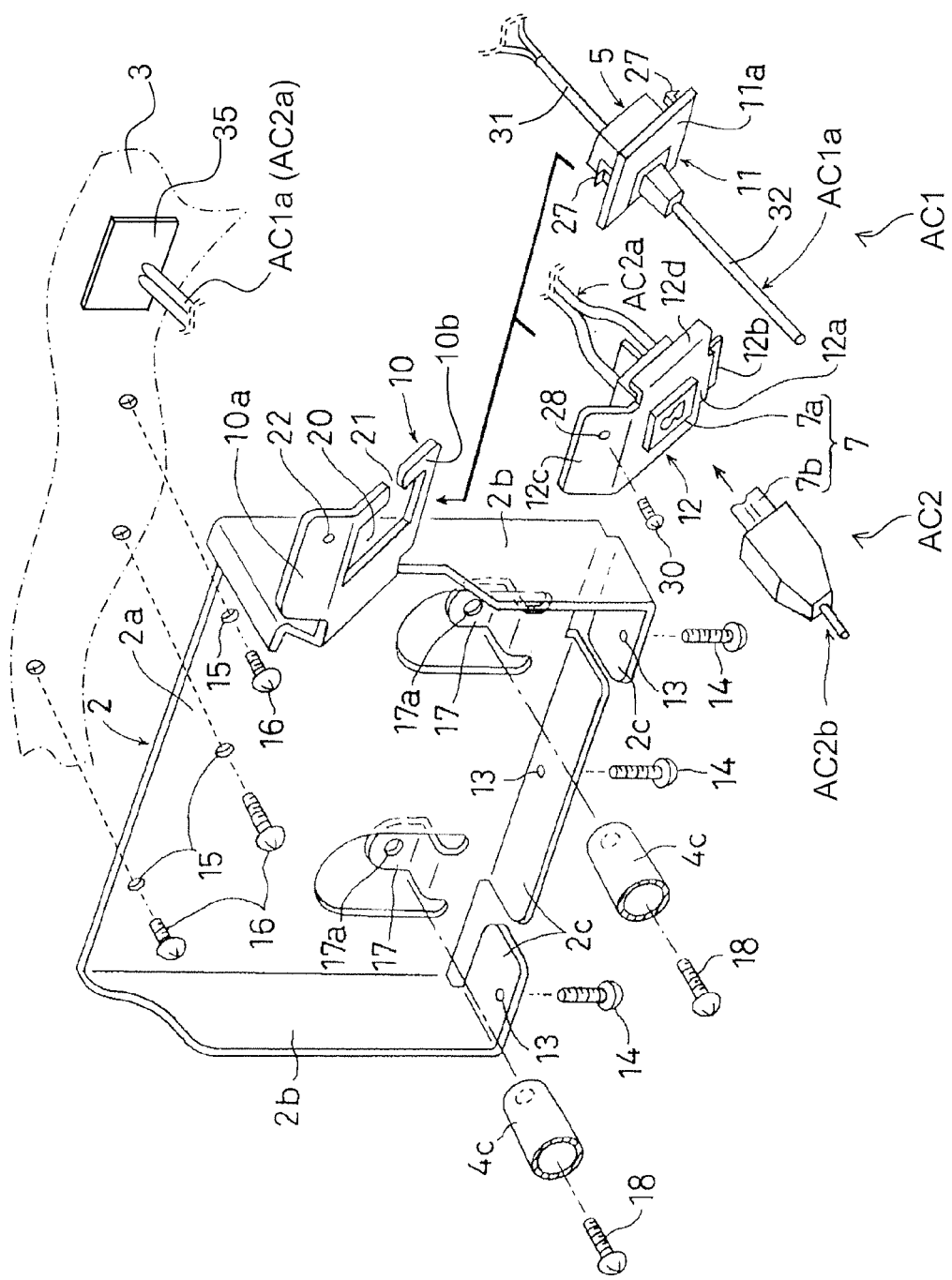
FIG. 1B is an exploded detailed perspective view of the flat panel display device illustrated in FIG. 1A.
Figure 2:
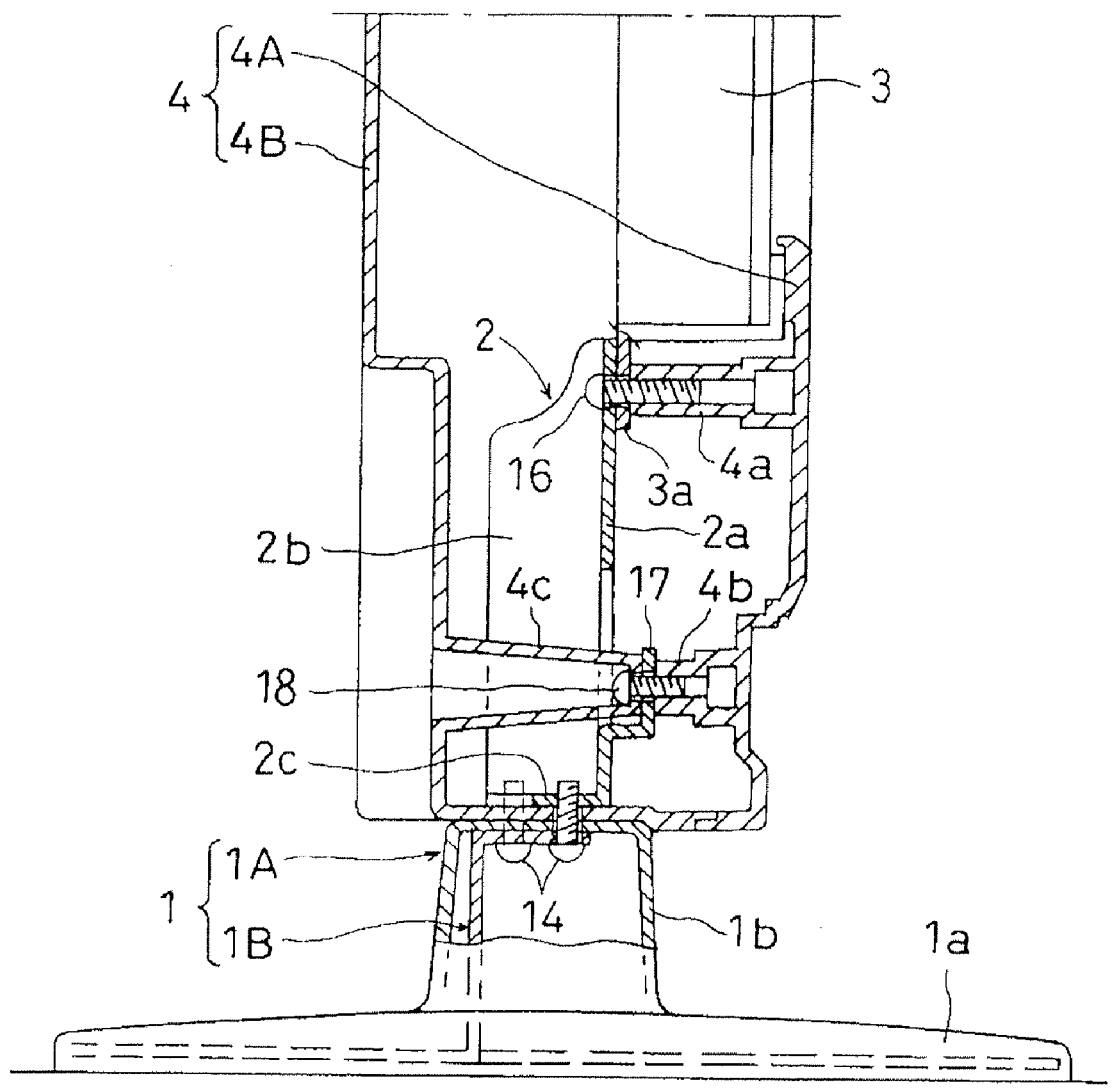
FIG. 2 is a vertical cross sectional view of a lower part of the flat panel display device illustrated in FIG. 1A.

FIGS. 1A, 1B and 2 illustrate main parts of a flat panel display device. The flat panel display device includes a liquid crystal television set. The flat panel display device has a stand 1, a linking bracket 2, a liquid crystal module (e.g., flat panel display component) 3, a cabinet 4 and a common holder (e.g., universal cord holder) 10. The liquid crystal module 3 is fixed on the stand 1 via the linking bracket 2. The liquid crystal module 3, the linking bracket 2 and the common holder 10 are covered with the cabinet 4. Specifically, the liquid crystal module 3, the linking bracket 2 and the common holder 10 are disposed within the cabinet 4. The stand 1 is fixedly coupled to the cabinet 4. One of an integrated power supply cord (e.g., non-detachable power supply cord) AC1 and an inlet-type power supply cord (e.g., detachable power supply cord) AC2 is selectively and electrically connected to a control board (e.g., electrical connection part) 35 of the liquid crystal module 3, and extends from the back of the cabinet 4. Furthermore, the common holder 10 includes a first attachment structure (e.g., non-detachable power supply cord attachment structure) for attaching the integrated power supply cord AC1, and a second attachment structure (e.g., detachable power supply cord attachment structure) for attaching the inlet-type power supply cord AC2.

The liquid crystal module 3 mainly includes a liquid crystal panel (e.g., liquid crystal cell) to display image. Furthermore, the liquid crystal module 3 mainly includes a frame, a light reflecting sheet, a light source, an optical sheet, and a bezel. The cabinet 4 has a front cabinet (e.g., front cabinet member) 4A and a rear cabinet (e.g., rear cabinet member) 4B, and houses the liquid crystal module 3 within an inside space (inner side) of the cabinet 4 defined by the front cabinet 4A and the rear cabinet 4B. The front cabinet 4A is rectangular when viewed from a front side of the flat panel display device, and is made of synthetic resin. The front cabinet 4A is integrally formed as a one-piece, unitary member. The rear cabinet 4B is coupled to a rear side of the front cabinet 4A, and is made of synthetic resin. The rear cabinet 4B is integrally formed as a one-piece, unitary member.

The integrated power supply cord AC1 has a lead (e.g., first lead) AC1a, an engagement protrusion 5 that is fixedly attached to an outer peripheral face of the lead AC1a and a support member (e.g., first support member) 11 that is coupled to the engagement protrusion 5 within the cabinet 4. The engagement protrusion 5 is removably attached to the common holder 10 via the support member 11. The support member 11 is engaged with the first attachment structure of the common holder 10. The lead AC1a is non-detachably and electrically connected to the control board 35 of the liquid crystal module 3 when the integrated power supply cord AC1 is connected to the liquid crystal module 3. An inside portion 31 of the lead AC1a is disposed inside of the cabinet 4 relative to the engagement protrusion 5 along the lead AC1a, and is mechanically and electrically coupled to the control board 35 of the liquid crystal module 3. An outside portion 32 of the lead AC1a is disposed outside of the cabinet 4 relative to the engagement protrusion 5 along the lead AC1a, and is mechanically and electrically coupled to an electric plug 33 that is removably connected to an electrical outlet. The inside and outside portions 31 and 32 of the integrated power supply cord AC1 is non-detachably and integrally formed as a one-piece member.

The inlet-type power supply cord AC2 has an inside lead (e.g., third lead) AC2a, an outside lead (e.g., second lead) AC2b, an inlet 7, and a support member (e.g., second support member) 12. The inlet 7 has a female part (e.g., female connector) 7a and a male part (male connector) 7b. The female and male parts 7a and 7b are fixedly and electrically coupled to the inside and outside leads AC2a and AC2b, respectively. The female and male part 7a and 7b are detachably fitted each other, and are interposed at some point along the inlet-type power supply cord AC2. The support member 12 is fixedly coupled to the female part 7a. The female part 7a is attached to the common holder 10 inside the cabinet 4 via the support member 12. The support member 12 is engaged with the second attachment structure of the common holder 10. The inside lead AC2a is disposed inside of the cabinet 4 relative to the support member 12 along the inlet-type power supply cord AC2, and is non-detachably and electrically coupled to both the control board 35 of the liquid crystal module 3 and the female part 7a when the inlet-type power supply cord AC2 is connected to the liquid crystal module 3. The outside lead AC2b is disposed outside of the cabinet 4 relative to the inside lead AC2a along the inlet-type power supply cord AC2, and is non-detachably and electrically coupled to both the male part 7b and an electric plug 34 that is removably connected to an electrical outlets. The inside and outside leads AC2a and AC2b of the inlet-type power supply cord AC2 are detachably and electrically connected to each other via the inlet 7. Thus, the outside lead AC2b can be detached from the inside lead AC2a by simply pulling out the male part 7b that is fitted to the female part 7a.

Figure 9A:
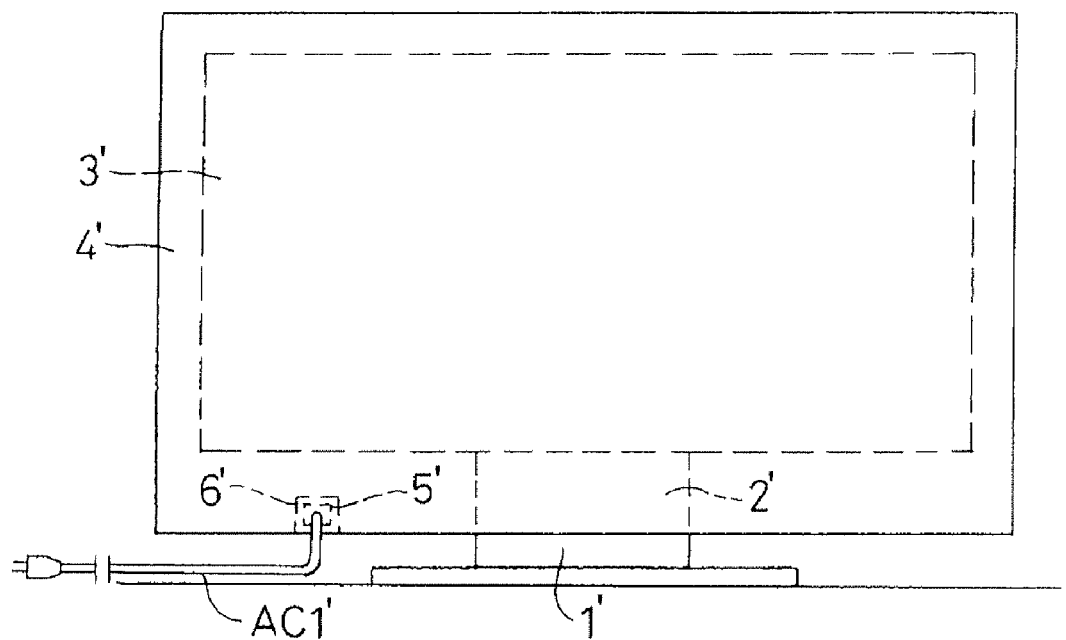
FIG. 9A is a rear elevational view of a conventional flat panel display device equipped with an integrated power supply cord.
Figure 9B:
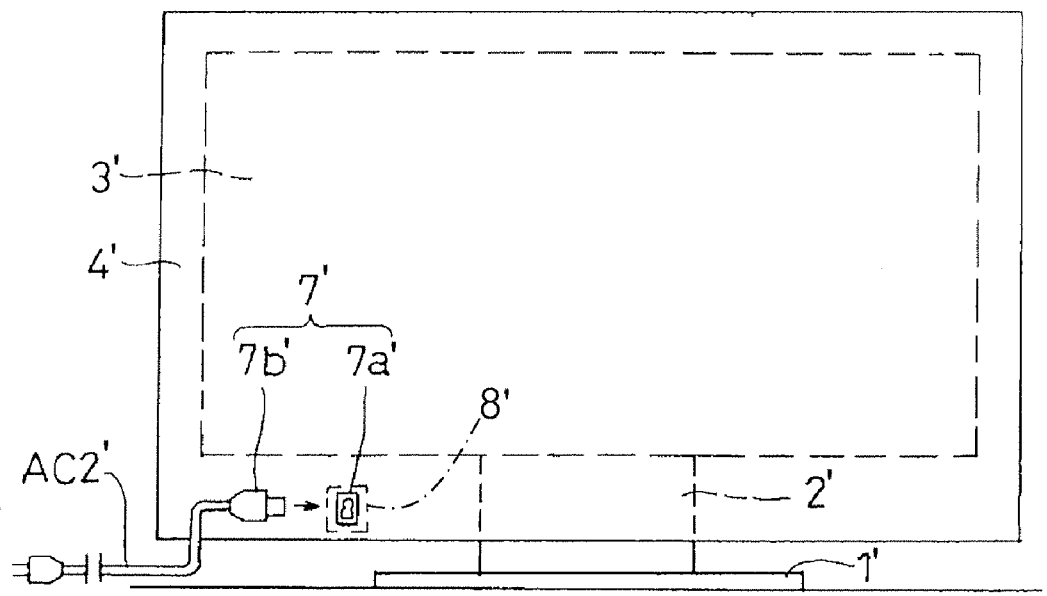
FIG. 9B is a rear elevational view of the conventional flat panel display device equipped with an inlet-type power supply cord.

The common holder 10 is integrally formed with the linking bracket 2 that links the stand 1 and the liquid crystal module 3. The common holder 10 and the linking bracket 2 are integrally formed as a one-piece, unitary member. The support member 11 is attached to the engagement protrusion 5 of the integrated power supply cord AC1. The engagement protrusion 5 is latched to the common holder 10 via the support member 11 when the integrated power supply cord AC1 is connected to the liquid crystal module 3. The support member 12 is attached to the female part 7a of the inlet 7 of the inlet-type power supply cord AC2. The female part 7a of the inlet 7 is latched to the common holder 10 via the support member 12 when the inlet-type power supply cord AC2 is connected to the liquid crystal module 3. Other than the above, the constitution is substantially the same as that shown in FIGS. 9A and 9B, so parts that are the same will be numbered the same without having a prime ('), and not described again.

As shown in FIG. 2, the cabinet 4 has the front cabinet 4A and the rear cabinet 4B that fit together. The stand 1 has a stand cover 1A and a stand core 1B. The stand cover 1 is made of a synthetic resin and includes a wide, flat base portion 1a and a riser 1b that is integrally provided on the base portion 1a. The base portion 1a and the riser 1b are integrally formed as a one-piece, unitary member. The stand core 1B is made of sheet metal and is fastened inside the stand cover 1A.

As shown in FIGS. 1B and 2, the linking bracket 2 is made of sheet metal. The linking bracket 2 has a bracket main body 2a, a pair of left and right side plates 2b, and three (e.g., left, middle, right) bottom plates 2c. The bracket main body 2a rises vertically. The left and right side plates 2b are bent at a right angle relative to the bracket main body 2a from both side edges of the bracket main body 2a. The bottom plates 2c are bent at a right angle relative to the side plates 2b and the bracket main body 2a from the lower end edges of the side plates 2b and from the lower end edge of the bracket main body 2a, respectively. The stand 1 is fixedly coupled to the linking bracket 2 by inserting screws 14 through through-holes (not shown) formed in the upper end portion of the stand core 1B and the bottom plate of the rear cabinet 4B and then by threading the screws 14 into screw holes 13 formed in the bottom plates 2c.

As shown in FIGS. 1B and 2, the linking bracket 2 is fixedly coupled to the liquid crystal module 3 by inserting screws 16 through a plurality of through-holes 15 formed in the upper part of the bracket main body 2a and then by threading the screws 16 into screw holes in bosses 4a of the front cabinet 4A and screw holes in a bezel 3a of the liquid crystal module 3.

As shown in FIGS. 1B and 2, the linking bracket 2 further includes a pair of left and right tongues 17. The tongues 17 are formed by bending forward left over portions that are formed by forming inverted U-shaped cut-outs on both sides of the lower part of the bracket main body 2a. The tongues 17 are bent forward in an approximate L shape. The front cabinet 4A has a pair of bosses 4b at locations corresponding to the tongues 17. The rear cabinet 4B has a pair of bosses 4c at locations corresponding to the tongues 17. The bosses 4b of the front cabinet 4A and the bosses 4c of the rear cabinet 4B are brought into contact with these tongues 17. Screws 18 are threaded into screw holes in the bosses 4b through holes 17a in the tongues 17 from the boss 4c side, so that the front cabinet 4A and the rear cabinet 4B are integrally linked.

As shown in FIG. 1B, the common holder 10 is bent outward from one of the side plates 2b and is angled downward. In particular, the common holder 10 extends form a front end portion of one of the side plates 2b, and extends downward as approaching to a rear end portion of the one of the side plates 2b. The common holder 10 is integrally formed with the linking bracket 2 as a one-piece, unitary member. The common holder 10 includes a rectangular holder hole 20 and a holder passageway (e.g., access gap) 21. The holder hole 20 is part of both of the first and second attachment structures of the common holder 10. The holder passage way 21 is also part of both of the first and second attachment structures of the common holder 10. The rectangular holder hole 20 is made in a center portion of the common holder 10. The holder passageway 21 communicates with the holder hole 20, and is formed across a side part of a peripheral portion 10b of the common holder 10. The peripheral portion 10b of the common holder 10 surrounds the center portion of the common holder 10. The peripheral portion 10b is part of both of the first and second attachment structures of the common holder 10. The inside lead AC2a that is located at a proximal end of the inlet-type power supply cord AC2 is connected to the female part 7a of the inlet-type power supply cord AC2. The inside lead AC2a of the inlet-type power supply cord AC2 or the inside portion 31 of the integrated power supply cord AC1 is fitted into and installed within the holder hole 20 through the holder passageway 21, allowing the cords AC1 and AC2 to be inserted and plugged into the holder hole 20 quickly and easily.

Also, a screw hole 22 is formed in an engagement tab (e.g., extension portion) 10a that is bent upward from an upper end edge of the common holder 10. The engagement tab 10a is part of the second attachment structure of the common holder 10. A cord insertion hole (e.g., opening) 23 is made in the rear cabinet 4B opposite the common holder 10 (see FIG. 3). The cord insertion hole 23 has a closed hole with a circumferential periphery. One of the integrated power supply cord AC1 and the inlet-type power supply cord AC2 is selectively disposed through the cord insertion hole 23. In particular, the engagement protrusion 5 of the integrated power supply cord AC1 is disposed through the cord insertion hole 23.

With the flat panel display device, one of the integrated power supply cord AC1 and the inlet-type power supply cord AC2 can be selectively attached via the common holder 10 to the liquid crystal module 3 of the flat panel display device.

Since only one kind of the common holder 10 is needed, the structure is simpler than in the conventional flat panel display device, so cost can be kept lower. Furthermore, only one kind of the rear cabinet 4B is needed. Thus, cost can be kept lower.

Also, the linking bracket 2 is utilized to form the common holder 10, so there is no increase in the number of required parts, which is more economical.

Figure 3:
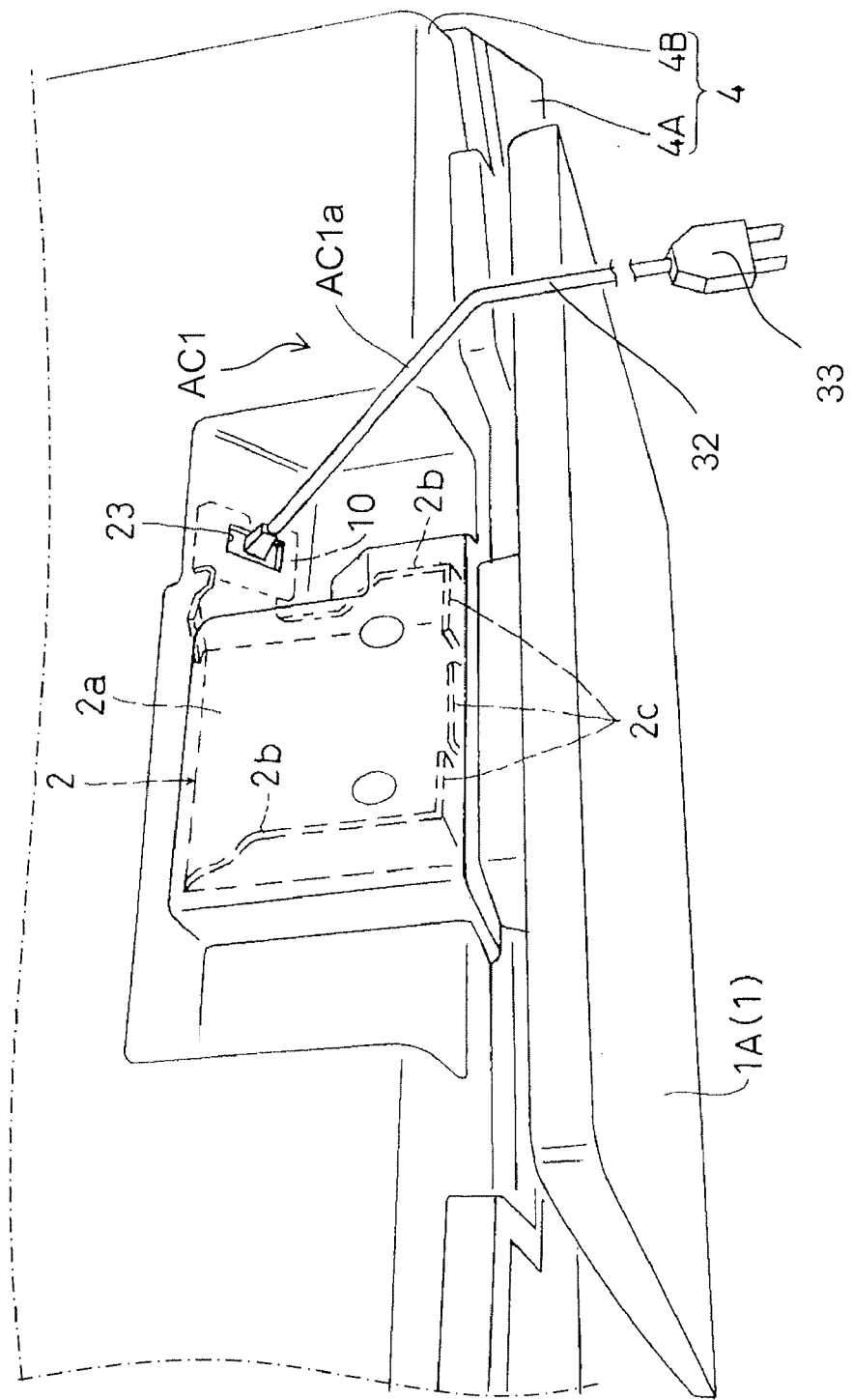
FIG. 3 is a partial rear perspective view of the flat panel display device illustrated in FIG. 1A with an integrated power supply cord attached.
Figure 4:
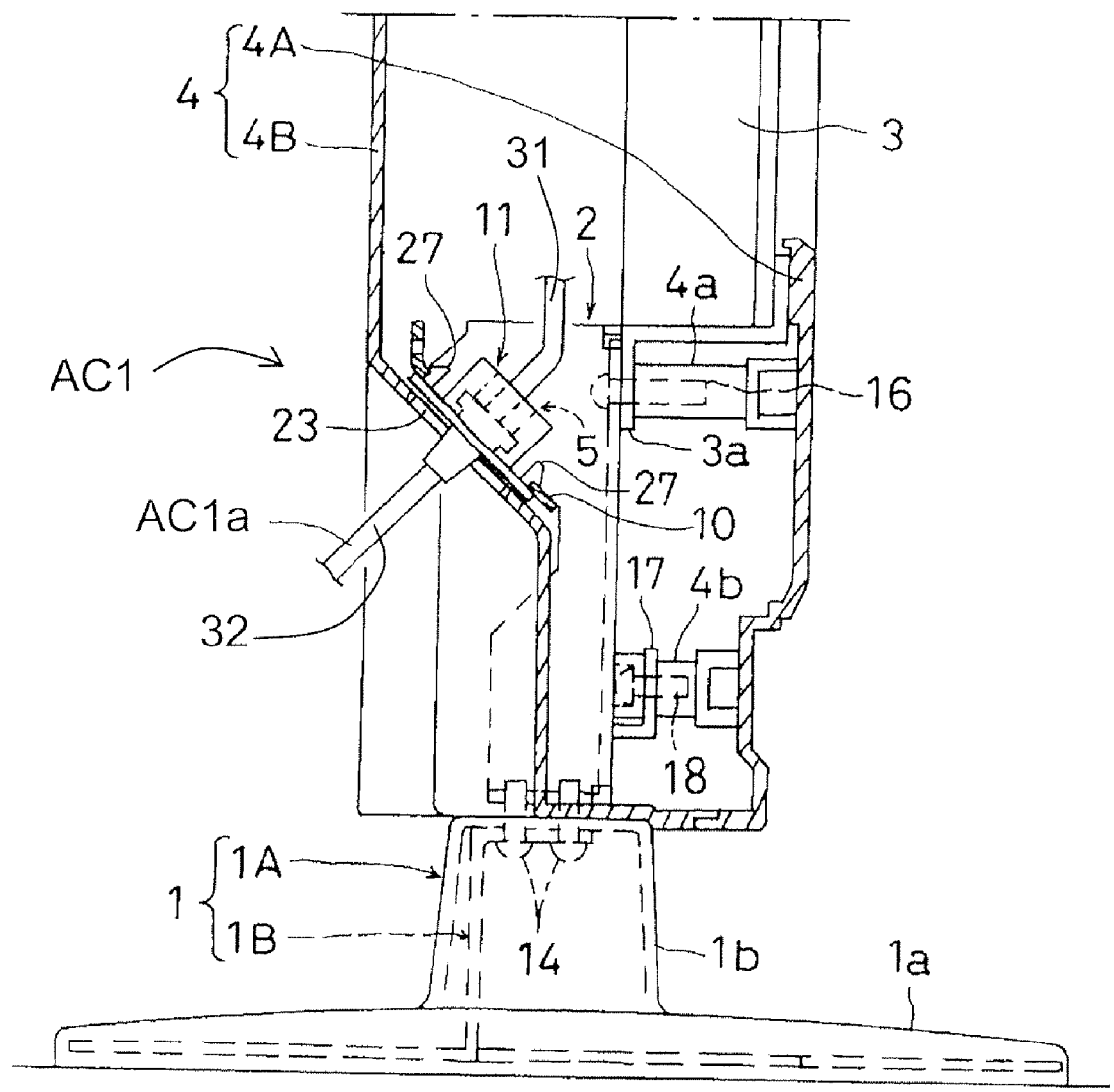
FIG. 4 is a vertical cross sectional view of the flat panel display device with the integrated power supply cord attached.
Figure 5A:
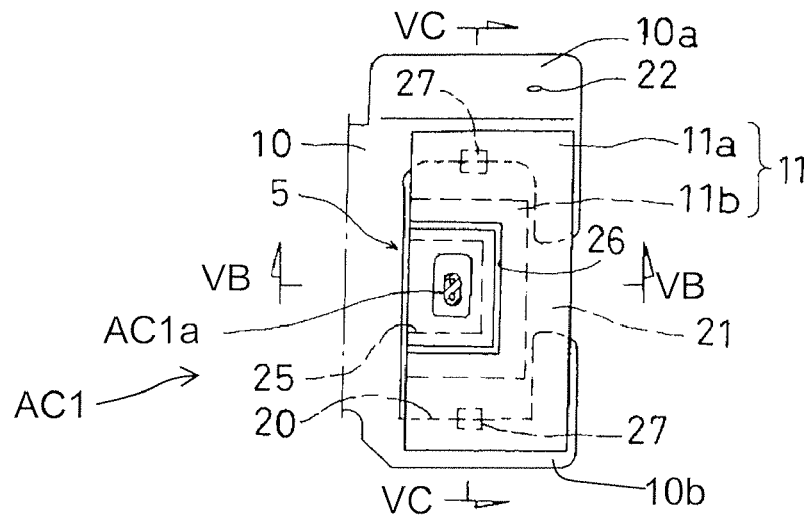
FIG. 5A is a normal view of an attachment structure of the integrated power supply cord.
Figure 5B:
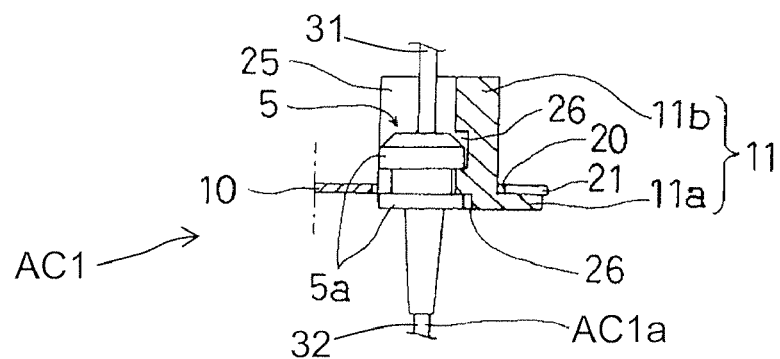
FIG. 5B is a cross sectional view taken along VB-VB line of FIG. 5A.

As shown in FIGS. 3 to 5, the support member 11 for the integrated power supply cord AC1 includes a support plate 11a, a main body 11b, a recess 25, a mating groove 26, and a pair of hooks 27. The support member 11 is integrally formed as a one-piece, unitary member. Furthermore, the support member 11 is formed as a separate member from the engagement protrusion 5 or the common holder 10. The support plate 11a is made of a synthetic resin material and is placed on the common holder 10. The main body 11b is integrally provided to the rear face of the support plate 11a and is inserted into the holder hole 20. The recess 25 is formed in the side faces of the support plate 11a and the main body 11b. The mating groove 26 is formed on the inside face of the recess 25. The mating groove 26 is aligned with a flange 5a of the engagement protrusion 5 so that the recess 25 is mated with the engagement protrusion 5, thereby attaching the support member 11 to the engagement protrusion 5.

As shown in FIGS. 4 and 5, the hooks 27 are integrally provided to the rear face of the support plate 11a opposite the inner peripheral edge of the holder hole 20. The hooks 27 are engaged with the peripheral portion 10b of the common holder 10 when the integrated power supply cord AC1 is connected to the liquid crystal module 3.

Figure 5C:
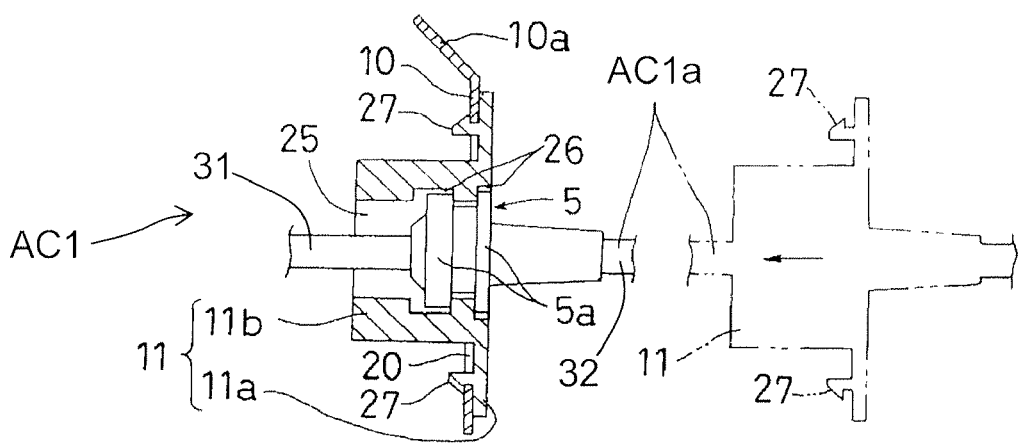
FIG. 5C is a cross sectional view taken along VC-VC line of FIG. 5A.

The procedure for attaching the integrated power supply cord AC1 will now be described. As shown in FIG. 5C, in a state in which the support member 11 has been attached to the engagement protrusion 5 of the integrated power supply cord AC1 (see FIG. 1B), the inside portion 31 of the integrated power supply cord AC1 is inserted through the holder passageway 21 into the holder hole 20. Then, the main body 11b is inserted into the holder hole 20, and the support plate 11a is pressed toward the common holder 10, which engages the hooks 27 with the inner peripheral edge of the holder hole 20 (or the peripheral portion 10b).

With the flat panel display device, the integrated power supply cord AC1 can be securely latched to the common holder 10 merely by pressing the support member 11 attached to the engagement protrusion 5 of the integrated power supply cord AC1 toward the common holder 10 and by engaging the hooks 27 of the support member 11 with the inner peripheral edge of the holder hole 20.

Figure 6:
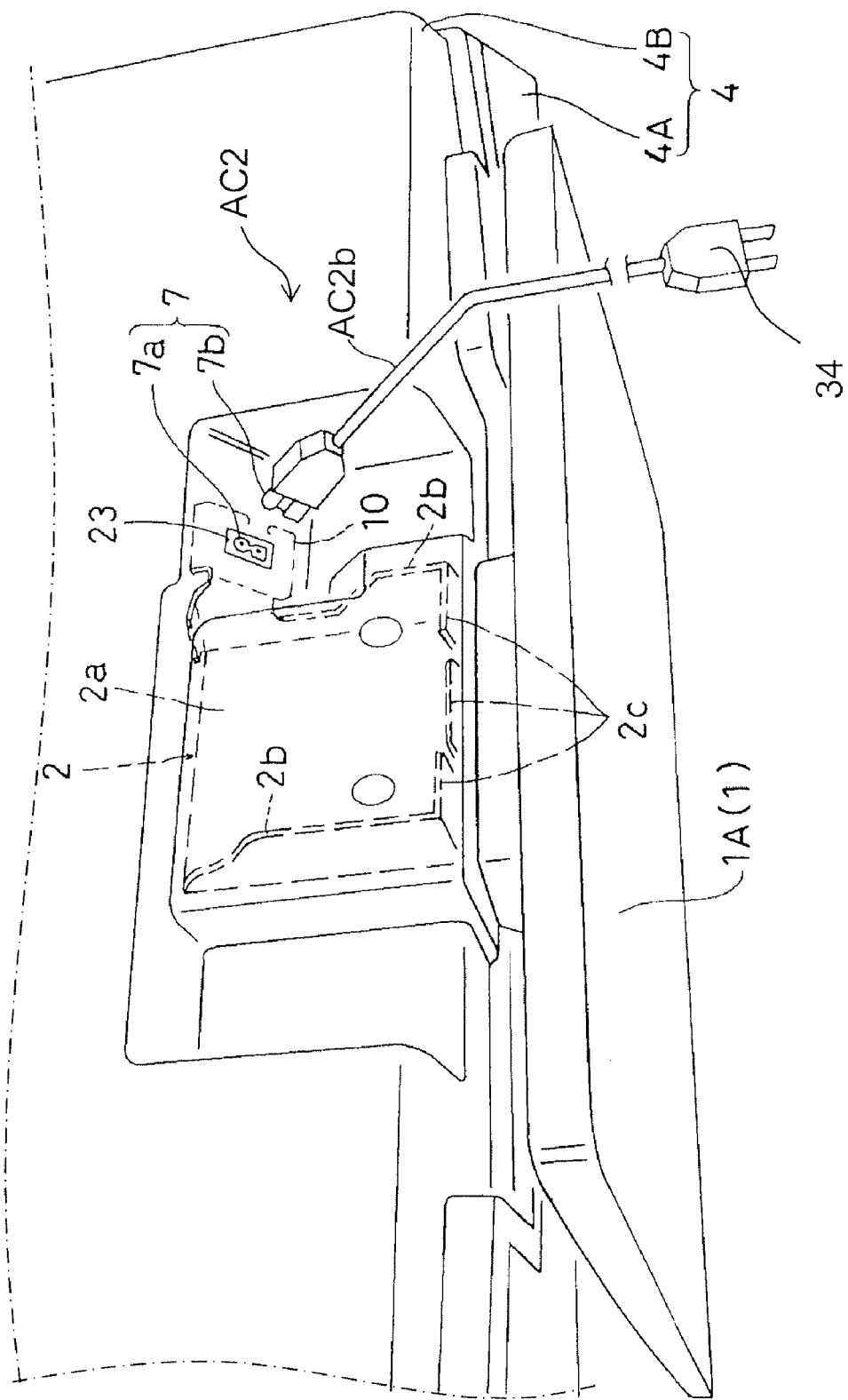
FIG. 6 is a partial rear perspective view of the flat panel display device illustrated in FIG. 1A with an inlet-type power supply cord attached.
Figure 7:
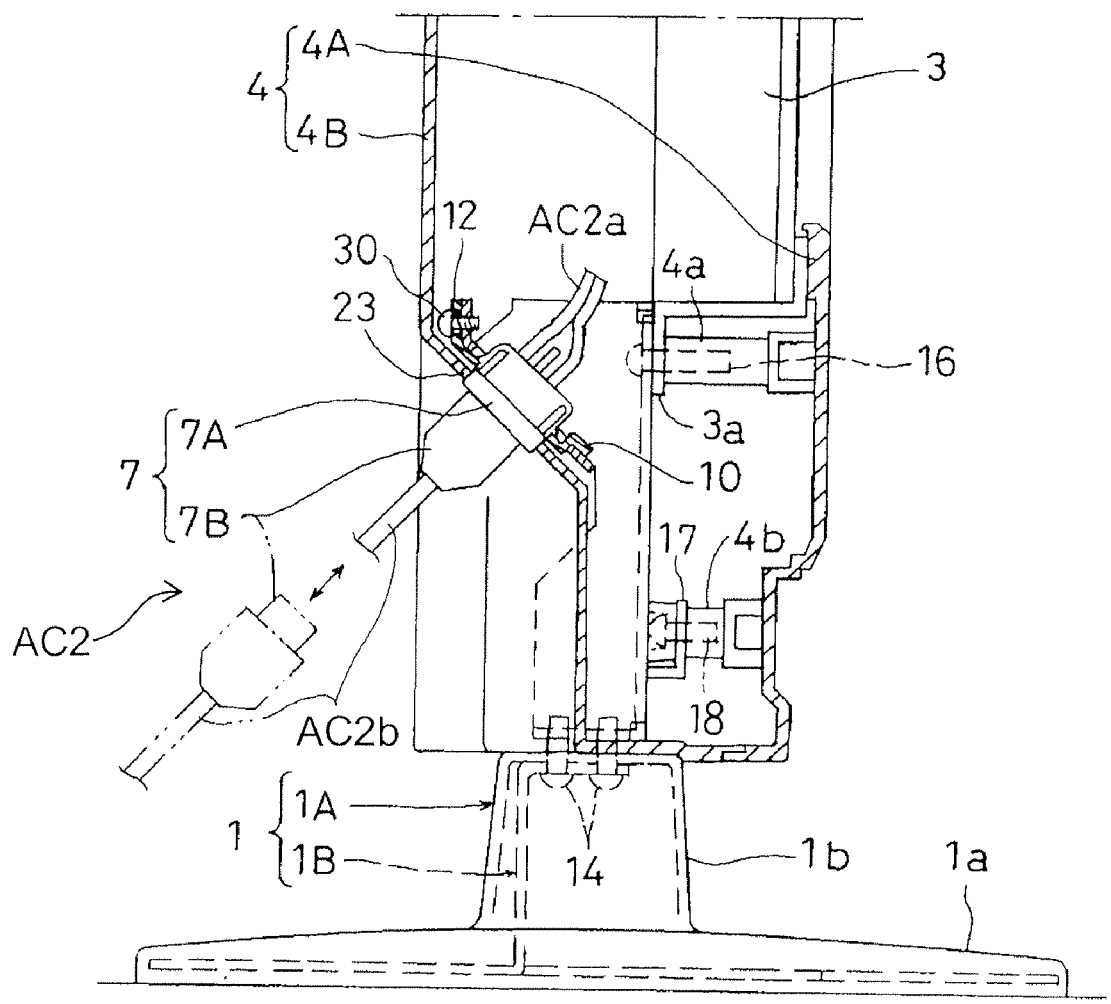
FIG. 7 is a vertical cross sectional view of the flat panel display device with the inlet-type power supply cord attached.
Figure 8A:
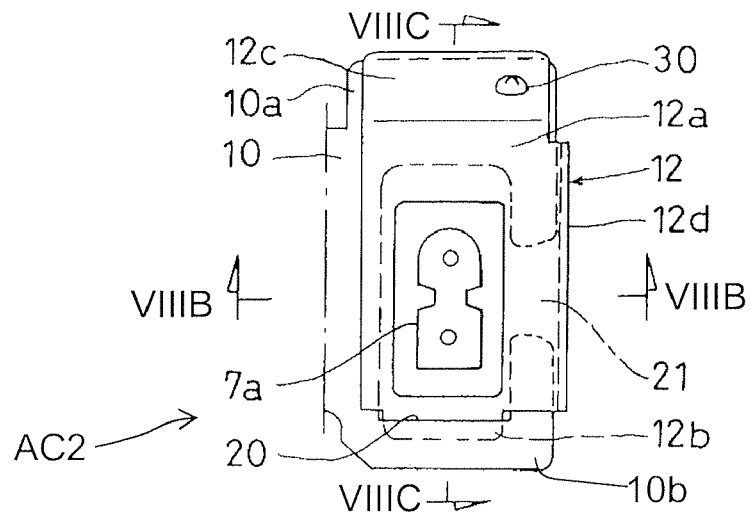
FIG. 8A is a normal view of an attachment structure of the inlet-type power supply cord.
Figure 8B:
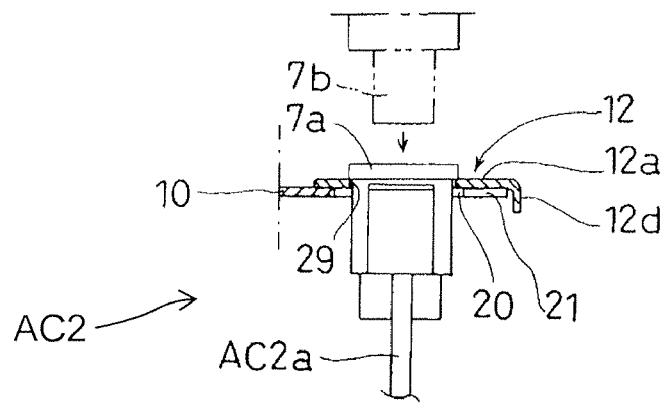
FIG. 8B is a cross sectional view taken along VIIIB-VIIIB line of FIG. 8A.

As shown in FIGS. 6 to 8, the support member 12 for the inlet-type power supply cord AC2 has a support plate 12a, a hooking tab 12b, an extension plate 12c, and a positioning side plate 12d. The support member 12 is integrally formed as a one-piece, unitary member. The support plate 12a is made of sheet metal and is placed on the common holder 10. The female part 7a of the inlet 7 is disposed through and latched to a latching hole 29 made in the center of the support plate 12a. The hooking tab 12b is bent substantially in an L shape and extends downward from the lower end edge (e.g., lower end part) of the support plate 12a. The extension plate 12c is bent upward along the engagement tab 10a from the upper end edge (e.g., upper end part) of the support plate 12a. The extension plate 12c includes a screw insertion hole 28 (see FIG. 1B). The screw insertion hole 28 is positioned concentrically with the screw hole 22 of the engagement tab 10a. The positioning side plate 12d is bent at a right angle relative to the support plate 12a along a side edge (e.g., side face) of the common holder 10 from the side edge (e.g., side end part) of the support plate 12a. The side edge of the common holder 10 is part of the second attachment structure of the common holder 10.

Figure 8C:
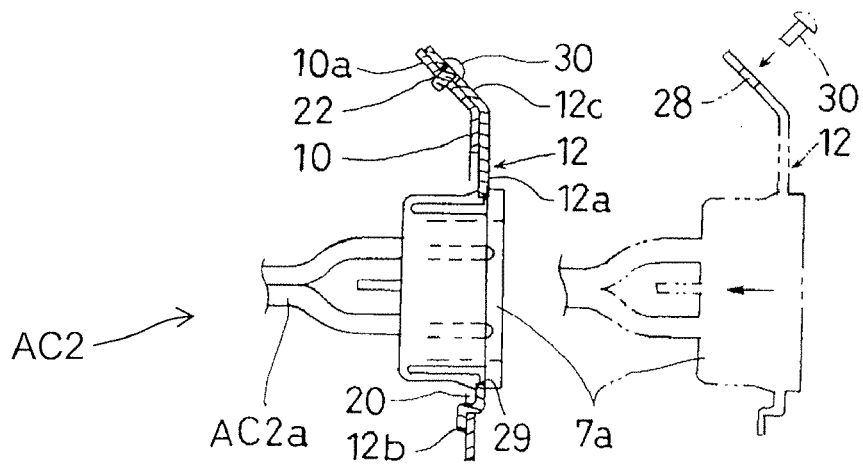
FIG. 8C is a cross sectional view taken along VIIIC-VIIIC line of FIG. 8A.

The procedure for attaching the inlet-type power supply cord AC2 will now be described. As shown in FIG. 8C, in a state in which the support member 12 has been attached to the female part 7a of the inlet-type power supply cord AC2 (see FIG. 1B), the inlet-type power supply cord AC2 is inserted through the holder passageway 21 into the holder hole 20. Then, the female part 7a is inserted into the holder hole 20, and the hooking tab 12b is engaged with the lower end edge (e.g., lower edge) of the holder hole 20. The lower end edge of the holder hole 20 is part of the second attachment structure of the common holder 10. The support plate 12a and the extension plate 12c of the support member 12 rest on the peripheral portion 10b and the engagement portion 10a of the common holder 10, respectively. A screw 30 is threaded into the screw hole 22 through the screw insertion hole 28, which latches the female part 7a to the common holder 10 via the support member 12. The male part 7b is plugged into the female part 7a.

With the flat panel display device, the screw insertion hole 28 can be positioned at the screw hole 22 merely by engaging the hooking tab 12b of the support member 12 attached to the female part 7a of the inlet-type power supply cord AC2 with the lower end edge of the holder hole 20 and aligning the positioning side plate 12d with the side edge of the common holder 10. The inlet-type power supply cord AC2 can be securely latched to the common holder 10 by threading the screw 30 into the screw hole 22 through the screw insertion hole 28.

With the flat panel display device, one of the integrated power supply cord AC1 and the inlet-type power supply cord AC2 can be selectively and electrically coupled to the liquid crystal module 3 with a simple and inexpensive structure.

The flat panel display device is not limited to the liquid crystal television set. For example, the flat panel display device can be applied to various other kinds of flat panel display device, such as a liquid crystal monitor.

General Interpretation of Terms

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of a flat panel display device equipped with the present invention. Accordingly, these terms, as utilized to describe the present invention should be interpreted relative to a flat panel display device equipped with the present invention as used in the normal operating position.

While only a preferred embodiment has been chosen to illustrate the present invention, it will be apparent to those skilled in the art from these disclosures that various changes and modifications can be made herein without departing from the scope of the invention as defined in the appended claims. The functions of one element can be performed by two, and vice versa. Every feature which is unique from the prior art, alone or in combination with other features, also should be considered a separate description of further inventions by the applicant, including the structural and/or functional concepts embodied by such feature. Furthermore, the foregoing descriptions of the preferred embodiment according to the present invention are provided for illustration only, and not for the purpose of limiting the invention as defined by the appended claims and their equivalents.

What is claimed is:

1. A flat panel display device comprising:
    a cabinet;
    a stand fixedly coupled to the cabinet;
    a flat panel display component disposed within the cabinet and fixedly coupled to the cabinet, the flat panel display component being selectively connected to one of a non-detachable power supply cord and a detachable power supply cord; and
    a universal cord holder including a non-detachable power supply cord attachment structure and a detachable power supply cord attachment structure, the universal cord holder being disposed within the cabinet,
    the non-detachable power supply cord attachment structure of the universal cord holder being configured to engage with a first support member of the non-detachable power supply cord when the non-detachable power supply cord is connected to the flat panel display component,
    the detachable power supply cord attachment structure of the universal cord holder being configured to engage with a second support member of the detachable power supply cord when the detachable power supply cord is connected to the flat panel display component.

2. The flat panel display device according to claim 1, wherein
    the universal cord holder includes a holder hole that is formed in a center portion of the universal cord holder and that is part of both of the non-detachable and detachable power supply cord attachment structures, and an access gap that is formed across a side part of a peripheral portion of the common holder and that is part of both of the non-detachable and detachable power supply cord attachment structures, with the access gap communicating with the holder hole such that the one of the non-detachable power supply cord and the detachable power supply cord is selectively installed within the holder hole through the access gap.

3. The flat panel display device according to claim 2, wherein
    the peripheral portion of the universal cord holder is configured to engage with a pair of hook portions of the first support member of the non-detachable power supply cord when the non-detachable power supply cord is connected to the flat panel display component, the first support member being integrally formed as a one-piece, unitary member.

4. The flat panel display device according to claim 2, wherein
    the detachable power supply cord attachment structures of the universal cord holder includes an extension portion with a screw hole, the extension portion extending upward from an upper part of the peripheral portion of the universal cord holder.

5. The flat panel display device according to claim 4, wherein
    the peripheral portion of the universal cord holder is configured to receive a support plate of the second support member of the detachable power supply cord when the detachable power supply cord is connected to the flat panel display component, the support plate having a latching hole through which a female connector of the detachable power supply cord that is detachably coupled to a male connector of the detachable power supply cord is disposed, the extension portion of the universal cord holder is configured to receive an extension plate of the second support member of the detachable power supply cord when the detachable power supply cord is connected to the flat panel display component, the extension plate extending upward from an upper end part of the support plate and having a screw insertion hole through which a screw threaded into the screw hole of the extension portion of the universal cord holder is disposed, a side face of the universal cord holder is configured to engage with a positioning side plate of the second support member of the detachable power supply cord when the detachable power supply cord is connected to the flat panel display component, the positioning side plate extending from a side end part of the support plate at a right angle relative to the support plate and being positioned along the side face of the universal cord holder, and a lower edge of the holder hole of the universal cord holder is configured to engage with a hooking tab of the second support member of the detachable power supply cord when the detachable power supply cord is connected to the flat panel display component, the hooking tab extending downward from a lower end part of the support plate and being formed in an L-shape.

6. The flat panel display device according claim 1, further comprising
a linking bracket disposed within the cabinet and fixedly coupled to both the stand and the flat panel display component.

7. The flat panel display device according claim 6, wherein the linking bracket is integrally formed with the universal cord holder as a one-piece, unitary member.

8. The flat panel display device according to claim 1, wherein
the cabinet further includes front and rear cabinet members, the rear cabinet member further having an opening with a circumferential periphery, the one of the non-detachable power supply cord and the detachable power supply cord being selectively disposed through the opening of the rear cabinet member.

9. A flat panel display device comprising:
a cabinet;
a stand fixedly coupled to the cabinet;
a flat panel display component disposed within the cabinet and fixedly coupled to the cabinet;
a universal cord holder including a non-detachable power supply cord attachment structure and a detachable power supply cord attachment structure, the universal cord holder being disposed within the cabinet; and
a non-detachable power supply cord being electrically connected to the flat panel display component, the non-detachable power supply cord having a first lead, an engagement protrusion that is fixedly attached to an outer peripheral face of the first lead and a first support member that is coupled to the engagement protrusion,
the first support member being attached to the non-detachable power supply cord attachment structure of the universal cord holder.

10. A flat panel display device comprising:
a cabinet;
a stand fixedly coupled to the cabinet;
a flat panel display component disposed within the cabinet and fixedly coupled to the cabinet;
a universal cord holder including a non-detachable power supply cord attachment structure and a detachable power supply cord attachment structure, the universal cord holder being disposed within the cabinet; and
a detachable power supply cord being electrically connected to the flat panel display component, the detachable power supply cord having second and third leads, male and female connectors that are fixedly and electrically coupled to the second and third leads, respectively, with the male and female connectors being detachably fitted each other, and a second support member that is coupled to the female connector,
the second support member being attached to the detachable power supply cord attachment structure of the universal cord holder.

11. A method for attaching one of a non-detachable power supply cord and a detachable power supply cord to a flat panel display device, the flat pane display device including
a cabinet,
a stand fixedly coupled to the cabinet,
a flat panel display component disposed within the cabinet and fixedly coupled to the cabinet, and
a universal cord holder including a non-detachable power supply cord attachment structure and a detachable power supply cord attachment structure, the universal cord holder being disposed within the cabinet, the method comprising:
selectively connecting the one of the non-detachable power supply cord and the detachable power supply cord to the flat panel display component;
engaging the non-detachable power supply cord attachment structure of the universal cord holder with a first support member of the non-detachable power supply cord when the non-detachable power supply cord is connected to the flat panel display component; and
engaging the detachable power supply cord attachment structure of the universal cord holder with a second support member of the detachable power supply cord when the detachable power supply cord is connected to the flat panel display component.

* * * * *